(12) United States Patent
Kobayashi

(10) Patent No.: US 8,884,500 B2
(45) Date of Patent: Nov. 11, 2014

(54) PIEZOELECTRIC VIBRATING REED HAVING ARMS WITH MULTIPLE GROOVES

(75) Inventor: Takashi Kobayashi, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 383 days.

(21) Appl. No.: 13/357,016

(22) Filed: Jan. 24, 2012

(65) Prior Publication Data

US 2012/0195170 A1    Aug. 2, 2012

(30) Foreign Application Priority Data

Jan. 27, 2011   (JP) ................. 2011-015440

(51) Int. Cl.
*H03H 9/21*   (2006.01)
*H03H 9/05*   (2006.01)
*H03H 9/10*   (2006.01)
*G04C 3/04*   (2006.01)
*G04R 20/10*  (2013.01)

(52) U.S. Cl.
CPC .............. *H03H 9/21* (2013.01); *H03H 9/0542* (2013.01); *H03H 9/1021* (2013.01); *G04C 3/047* (2013.01); *G04R 20/10* (2013.01)
USPC ....................................................... 310/370

(58) Field of Classification Search
CPC ......... H03H 9/21; H03H 9/215; G06B 1/0659
USPC ....................................................... 310/370
See application file for complete search history.

(56) References Cited

U.S. PATENT DOCUMENTS

| 7,067,966 | B2 * | 6/2006 | Tanaya ..................... 310/367 |
| 7,112,915 | B2 * | 9/2006 | Tanaya et al. ............. 310/370 |
| 7,168,319 | B2 * | 1/2007 | Dalla Piazza et al. ..... 73/504.16 |
| 7,253,554 | B2 * | 8/2007 | Dalla Piazza et al. ........ 310/370 |
| 7,412,886 | B2 * | 8/2008 | Dalla Piazza et al. ..... 73/504.16 |
| 7,863,803 | B2 * | 1/2011 | Yamada et al. ............. 310/370 |
| 7,863,804 | B2 * | 1/2011 | Tanaya ........................ 310/370 |
| 7,986,077 | B2 * | 7/2011 | Yamamoto .................. 310/370 |
| 8,182,703 | B2 * | 5/2012 | Yamada et al. .............. 216/2 |
| 8,299,863 | B2 * | 10/2012 | Tanaya et al. ............. 331/156 |
| 8,400,049 | B2 * | 3/2013 | Yang et al. ................. 310/370 |
| 8,432,087 | B2 * | 4/2013 | Yamada et al. ............. 310/370 |
| 8,587,184 | B2 * | 11/2013 | Yang et al. ................. 310/370 |
| 2010/0164332 | A1 * | 7/2010 | Kawanishi .................. 310/370 |
| 2011/0215680 | A1 * | 9/2011 | Yamada et al. ............. 310/370 |
| 2012/0039153 | A1 * | 2/2012 | Kobayashi .................. 368/159 |
| 2013/0076210 | A1 * | 3/2013 | Minegishi ................... 310/370 |
| 2013/0076211 | A1 * | 3/2013 | Arimatsu .................... 310/370 |

FOREIGN PATENT DOCUMENTS

JP    2002-076827 A    3/2002
JP    2013223009 A  * 10/2013

\* cited by examiner

*Primary Examiner* — J. San Martin
(74) *Attorney, Agent, or Firm* — Brinks, Gilson & Lione

(57) ABSTRACT

A piezoelectric vibrating reed includes: a pair of vibrating arm portions arranged in a line; an outer groove portion and an inner groove portion formed on both principal surfaces of the vibrating arm portions so as to extend along the Y direction (longitudinal direction) of the vibrating arm portions; and a base portion to which the pair of vibrating arm portions are connected, in which a plurality of groove portions is formed so as to be arranged in a line in the X direction (width direction) of the vibrating arm portions.

11 Claims, 14 Drawing Sheets

PIEZOELECTRIC VIBRATING REED HAVING ARMS WITH MULTIPLE GROOVES

RELATED APPLICATIONS

This application claims priority under 35 U.S.C. §119 to Japanese Patent Application No. 2011-015440 filed on Jan. 27, 2011, the entire content of which is hereby incorporated by reference.

BACKGROUND OF THE INVENTION

1. Field of the Invention

The present invention relates to a piezoelectric vibrating reed, and a piezoelectric vibrator, an oscillator, an electronic device, and a radio-controlled timepiece each using the piezoelectric vibrating reed.

2. Description of the Related Art

Piezoelectric vibrators using crystal or the like are used in mobile phones or mobile information terminals as a time source, a control signal timing source, a reference signal source, and the like. Various piezoelectric vibrators are available as such kinds of piezoelectric vibrators, and a piezoelectric vibrator having a tuning-fork type piezoelectric vibrating reed is also known as one of the piezoelectric vibrators.

However, in recent years, with miniaturization of devices on which the piezoelectric vibrating reed is mounted, a further reduction in the size of the piezoelectric vibrating reed is desired. As a method of realizing size reduction of the piezoelectric vibrating reed while suppressing the CI value (Crystal Impedance) of a piezoelectric vibrator to a low value, a method of forming groove portions on both principal surfaces of a vibrating arm portion of the piezoelectric vibrating reed is known (for example, see JP-A-2002-76827).

FIG. 14 is a view illustrating the related art and is also a cross-sectional view along the surface vertical to the longitudinal direction of a vibrating arm portion 203 disclosed in JP-A-2002-76827. As shown in FIG. 14, a first excitation electrode 210 is mainly formed inside a groove portion 205, a second excitation electrode 211 is formed on the side surfaces of the vibrating arm portion 203. The vibrating arm portion 203 has an approximately H-shaped cross-section.

In general, the CI value of a piezoelectric vibrating reed in which the groove portion 205 is formed is known to depend on the width D between the side surface 203a of the vibrating arm portion 203 and the side surface 205a of the groove portion. Specifically, the CI value can be suppressed to a low value by narrowing the width D.

Moreover, in order to realize high performance of the piezoelectric vibrating reed, it is important to suppress vibration leakage and secure favorable driving level characteristics.

Here, vibration leakage means leakage of vibration energy in which vibration of a piezoelectric vibrating reed leaks to the outside when the piezoelectric vibrating reed is operated. Since the vibration leakage leads to degradation of efficiency of the piezoelectric vibrating reed, it is necessary to suppress the vibration leakage as much as possible.

Moreover, the driving level characteristics means the variation characteristics of the vibration frequency of the piezoelectric vibrating reed with respect to variation of a driving voltage. The smaller the variation $\Delta f$ of the vibration frequency, the more favorable the driving level characteristics and the higher the performance of the piezoelectric vibrating reed.

In general, the vibration leakage and driving level characteristics of the piezoelectric vibrating reed are known to depend on the rigidity of the vibrating arm portion 203. Moreover, the rigidity of the vibrating arm portion 203 depends on the area S (hereinafter referred to as a "cross-sectional area S of a vibrating arm portion") of a cross-section vertical to the longitudinal direction of the vibrating arm portion 203. Thus, the vibration leakage and the driving level characteristics depend on the cross-sectional area S of the vibrating arm portion 203. Specifically, by increasing the cross-sectional area S of the vibrating arm portion 203 to increase the rigidity of the vibrating arm portion 203, it is possible to suppress the vibration leakage and to secure favorable driving level characteristics.

However, a piezoelectric vibrating reed disclosed in JP-A-2002-76827 includes a base portion in which a base electrode portion (corresponding to the "mount electrode" of the present disclosure), a vibrating narrow rod (corresponding to the "vibrating arm portion" of the present disclosure) formed so as to protrude from the base portion, a groove portion having a groove electrode portion (corresponding to an "excitation electrode" of the present disclosure) formed on the top surface and/or the bottom surface of the vibrating narrow rod, and a connection electrode portion (corresponding to an "extraction electrode" of the present disclosure) connecting the base electrode portion and the groove electrode portion to each other. The width on the base end side of the groove portion is narrower than the other portions, and a large region for forming the connection electrode portion is secured. In the JP-A-2002-76827, since the cross-sectional area S on the base end side of the vibrating arm portion 203 is increased, as a result, the rigidity on the base end side of the vibrating arm portion is increased.

However, in the JP-A-2002-76827, since the rigidity of only the base end side of the vibrating arm portion is increased, it is difficult to secure sufficient rigidity of the entire vibrating arm portion 203. Thus, it may be difficult to suppress the vibration leakage and to secure favorable driving level characteristics. Moreover, on the base end side, since the width D (see FIG. 14) between the side surface of the vibrating arm portion and the side surface of the groove portion is increased, the CI value may increase.

SUMMARY OF THE INVENTION

Therefore, it is an object of the invention to provide a piezoelectric vibrating reed capable of suppressing a CI value to a low value while suppressing vibration leakage and securing favorable driving level characteristics, a piezoelectric vibrator, an oscillator, an electronic device, and a radio-controlled timepiece each using the piezoelectric vibrating reed.

In order to attain the objects, according to an aspect of the invention, there is provided a piezoelectric vibrating reed including: a pair of vibrating arm portions arranged in a line; a groove portion formed on both principal surfaces of the vibrating arm portion so as to extend in the longitudinal direction of the vibrating arm portions; and a base portion to which the pair of vibrating arm portions are connected, wherein a plurality of the groove portions is formed in the respective vibrating arm portions so as to be arranged in a line in the width direction of the vibrating arm portions.

According to the above aspect of the present invention, since a plurality of groove portions is formed so as to be arranged in the width direction of the vibrating arm portions, whereby a wall is formed between the respective groove portions, it is possible to increase the cross-sectional area of the vibrating arm portion in the entire region where the groove portions are formed. In this way, since the rigidity of the vibrating arm portion in the entire region where the groove portions are formed can be increased more than when the width on the base end side of one groove portion is narrowed as in the case of JP-A-2002-76827, it is possible to suppress vibration leakage and to secure favorable driving level characteristics. Moreover, the rigidity of the vibrating arm portion is increased even when the width on the base end side of the groove portion is not narrowed as in the case of JP-A-2002-76827. Therefore, it is possible to decrease the width between the side surface of the vibrating arm portion and the side surface of the groove portion in the entire region where the groove portions are formed and to suppress the CI value to a low value.

Moreover, three groove portions may be formed in one vibrating arm portion, and a central groove base end portion on the base end side of the vibrating arm portion, of a central groove portion disposed at the center in the width direction among the three groove portions may be disposed in the vicinity of the connection portion between the base portion and the vibrating arm portion, and a side groove base end portion on the base end side of a side groove portion disposed on both sides in the width direction of the central groove portion among the three groove portions may be disposed closer to the distal end side of the vibrating arm portion than the central groove base end portion.

According to the above configuration of the present invention, since the side groove base end portion of the side groove portion is disposed closer to the distal end side than the central groove base end portion of the central groove portion, it is possible to increase the cross-sectional area on the base end side of the vibrating arm portion more than the cross-sectional area on the distal end side of the vibrating arm portion by the amount corresponding to the area of the side groove portion. In this way, since the rigidity on the base end side of the vibrating arm portion can be increased, it is possible to suppress the vibration leakage more and to secure more favorable driving level characteristics. As a result, the balance between the vibration leakage, the driving level characteristics, and the CI value can be adjusted to be in a desired state.

Moreover, the width of the groove portion on the base end side of the vibrating arm portion may be narrower than the width of the groove portion on the distal end side of the vibrating arm portion.

According to the above configuration of the present invention, the width between the side surface of the vibrating arm portion and the side surface of the groove portion on the base end side of the vibrating arm portion is large, and the gap between the neighboring groove portions on the base end side of the vibrating arm portion is large. Thus, it is possible to increase the cross-sectional area on the base end side of the vibrating arm portion more than the cross-sectional area on the distal end side of the vibrating arm portion. In this way, since the rigidity on the base end side of the vibrating arm portion can be increased, it is possible to suppress the vibration leakage more and to secure more favorable driving level characteristics. As a result, the balance between the vibration leakage, the driving level characteristics, and the CI value can be adjusted to be in a desired state.

Moreover, the gap between the neighboring groove portions on the base end side may be larger than the gap between the neighboring groove portions on the distal end side.

According to the above configuration of the present invention, by increasing the gap between the neighboring groove portions on the base end side of the vibrating arm portion, it is possible to increase the cross-sectional area on the base end side of the vibrating arm portion more than the cross-sectional area on the distal end side of the vibrating arm portion without increasing the width between the side surface of the vibrating arm portion and the side surface of the groove portion. In this way, it is possible to suppress vibration leakage while maintaining the CI value at a desired value and to secure favorable driving level characteristics.

According to another aspect of the invention, there is provided a piezoelectric vibrator including the above-described piezoelectric vibrating reed.

According to the above aspect of the invention, since the piezoelectric vibrator includes the piezoelectric vibrating reed having excellent characteristics, it is possible to provide a piezoelectric vibrator having good performance.

According to yet another aspect of the invention, there is provided an oscillator in which the above-described piezoelectric vibrator is electrically connected to an integrated circuit as a vibrator.

According to yet another aspect of the invention, there is provided an electronic device in which the above-described piezoelectric vibrator is electrically connected to a clock section.

According to yet another aspect of the invention, there is provided a radio-controlled timepiece in which the above-described piezoelectric vibrator is electrically connected to a filter section.

According to the oscillator, the electronic device, and the radio-controlled timepiece according to the above aspects of the invention, since the oscillator, the electronic device, and the radio-controlled timepiece each include the piezoelectric vibrator having good performance, it is possible to provide an oscillator, an electronic device, and a radio-controlled timepiece having improved performance.

According to the above aspect of the present invention, since a plurality of groove portions is formed so as to be arranged in the width direction of the vibrating arm portions, whereby a wall is formed between the respective groove portions, it is possible to increase the cross-sectional area of the vibrating arm portion in the entire region where the groove portions are formed. In this way, since the rigidity of the vibrating arm portion in the entire region where the groove portions are formed can be increased more than when the width on the base end side of one groove portion is narrowed as in the case of JP-A-2002-76827, it is possible to suppress vibration leakage and to secure favorable driving level characteristics. Moreover, the rigidity of the vibrating arm portion is increased even when the width on the base end side of the groove portion is not narrowed as in the case of JP-A-2002-76827. Therefore, it is possible to decrease the width between the side surface of the vibrating arm portion and the side surface of the groove portion in the entire region where the groove portions are formed and to suppress the CI value to a low value.

DESCRIPTION OF THE PREFERRED EMBODIMENTS

Hereinafter, an embodiment of the present invention will be described with reference to the accompanying drawings.
(Piezoelectric Vibrating Reed)

First, a piezoelectric vibrating reed according to the embodiment will be described with reference to the accompanying drawings.

Figure 1:
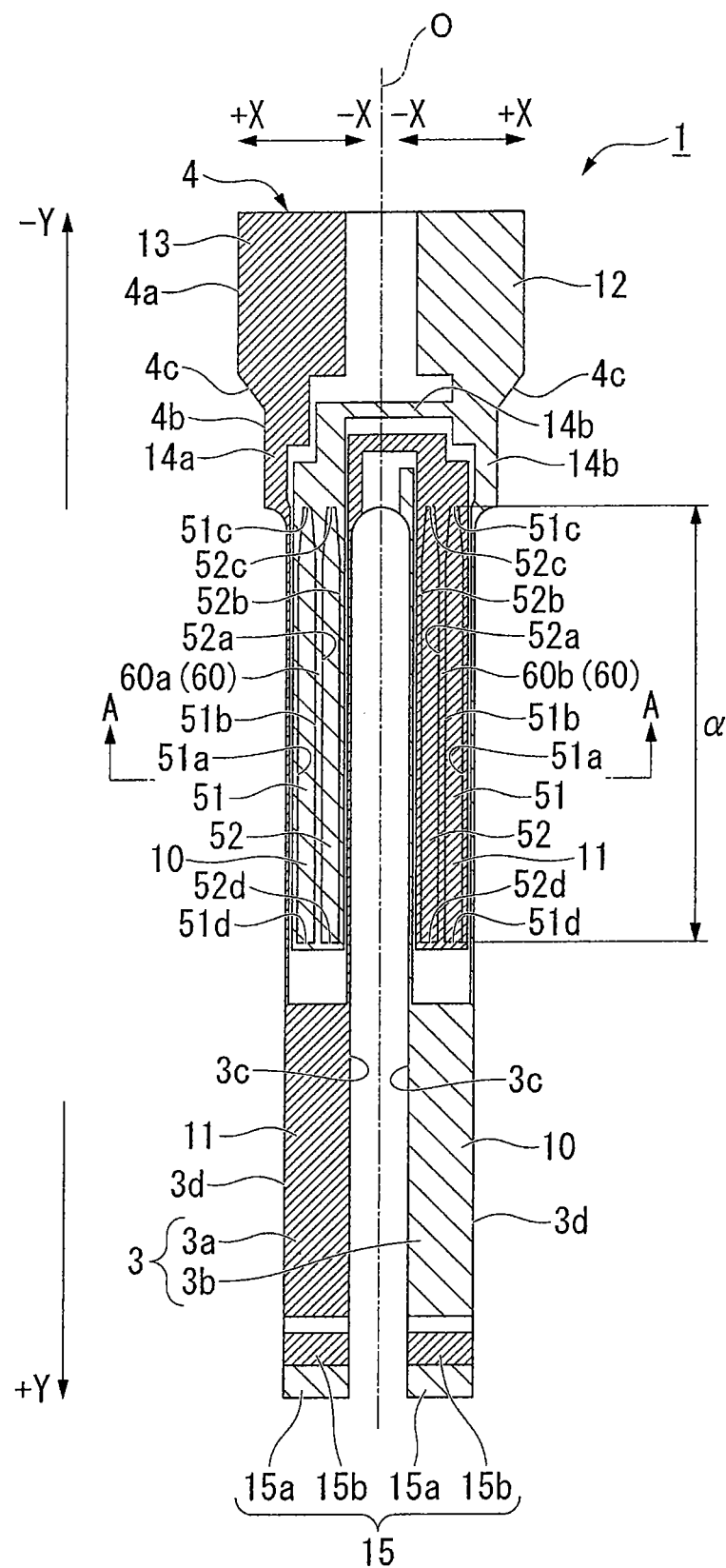
FIG. 1 is a plan view of a piezoelectric vibrating reed.

FIG. 1 is a plan view of a piezoelectric vibrating reed 1.

Figure 2:
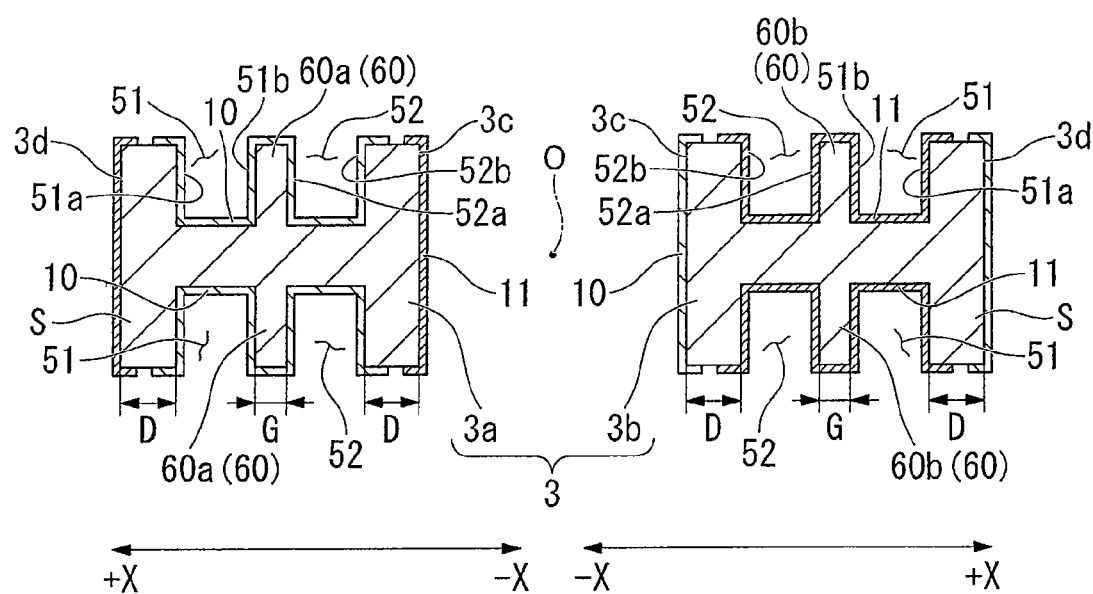
FIG. 2 is a cross-sectional view taken along the line A-A in FIG. 1.

FIG. 2 is a cross-sectional view taken along the line A-A in FIG. 1.

As shown in FIG. 1, a piezoelectric vibrating reed 1 of the present embodiment includes a pair of vibrating arm portions 3a and 3b arranged in a line, and a base portion 4 to which the pair of vibrating arm portions 3a and 3b are connected. In the following description, the width direction in which the vibrating arm portions 3a and 3b are arranged in a line will be referred to as the X direction, the central axis in the X direction be referred to as "O", the inner side of the piezoelectric vibrating reed 1 be referred to as the negative (−) X side, and the outer side thereof be referred to as the positive (+) X side. Moreover, the longitudinal direction of the piezoelectric vibrating reed 1 will be referred to as the Y direction, the base end side thereof will be referred to as the negative (−) Y side, and the distal end side thereof be referred to as the positive (+) Y side.

The piezoelectric vibrating reed 1 of the present embodiment is a tuning-fork type vibrating reed which is made of a piezoelectric material such as crystal, lithium tantalate, or lithium niobate and is configured to vibrate when a predetermined voltage is applied thereto.

The pair of vibrating arm portions 3a and 3b extend in the Y direction along the central axis O and are arranged in a line approximately in parallel to the X direction. An outer groove portion 51 and an inner groove portion 52 extending in the Y direction of the vibrating arm portions 3a and 3b are formed on both principal surfaces (the top surface and the bottom surface) of the vibrating arm portions 3a and 3b. Here, one vibrating arm portion 3a and the other vibrating arm portion 3b have a shape linearly symmetric to the central axis O. Thus, in the following description, the outer groove portion 51 and the inner groove portion 52 formed in one vibrating arm portion 3a will be described, and the description of the outer groove portion 51 and the inner groove portion 52 formed in the other vibrating arm portion 3b will not be provided.
(Groove Portion)

As shown in FIG. 1, in the vibrating arm portion 3a of the present embodiment, two groove portions are formed, which are the outer groove portion 51 disposed on the positive (+) X side of the vibrating arm portion 3a and the inner groove portion 52 disposed on the negative (−) X side of the vibrating arm portion 3a. The outer groove portion 51 and the inner groove portion 52 extend in the Y direction along the central axis O and are arranged in a line approximately in parallel to the X direction.

An outer groove base end portion 51c on the negative (−) Y side of the outer groove portion 51 is disposed in the vicinity of the connection portion between the vibrating arm portion 3a and the base portion 4. Moreover, outer groove distal end portion 51d on the positive (+) Y side of the outer groove portion 51 is disposed approximately at the center in the Y direction of the vibrating arm portion 3a. That is, the outer groove portion 51 is formed to a predetermined depth along the Y direction so as to extend over a range from the vicinity of the connection portion between the vibrating arm portion 3a and the base portion 4 to approximately the center in the Y direction of the vibrating arm portion 3a.

Moreover, the outer groove portion 51 is formed so that the width of the outer groove base end portion 51c is narrower than the width of the outer groove distal end portion 51d. Specifically, the outer side surface 51a and the inner side surface 51b of the outer groove portion 51 are formed so as to extend from the outer groove distal end portion 51d approximately in parallel toward the negative (−) Y side, and at a predetermined position, the outer side surface 51a is sloped toward the inner side over the outer groove base end portion 51c and the inner side surface 51b is sloped toward the outer side, whereby the width of the outer groove portion 51 is gradually narrowed in a tapered shape.

The inner groove portion 52 is formed on the negative (−) X side of the outer groove portion 51. The inner groove portion 52 is formed in the range of the negative (−) X side than the center in the X direction of the vibrating arm portion 3a so as to have approximately the same length as the outer groove portion 51 along the Y direction. Since the outer shape of the inner groove portion 52 is the same as the outer groove portion 51, detailed description thereof will not be provided.

The outer groove portion 51 and the inner groove portion 52 are formed so that the width D between the outer side surface 51a of the outer groove portion 51 and the outer side surface 3d of the vibrating arm portion 3a is the same as the width D between the inner side surface 52b of the inner groove portion 52 and the inner side surface 3c of the vibrating arm portion 3a. In the present embodiment, the width D can be narrowed more than that of JP-A-2002-76827. As described above, the CI value of the piezoelectric vibrating reed 1 depends on the width D, and the CI value is suppressed to a low value by narrowing the width D.

A wall portion 60a having the width of G is formed between the outer groove portion 51 and the inner groove portion 52. In a region where the outer groove portion 51 and the inner groove portion 52 are formed approximately in parallel, the width G of the wall portion 60a is approximately constant. Moreover, in a region where the outer groove portion 51 and the inner groove portion 52 are gradually narrowed in a tapered shape, the width G increases gradually from the positive (+) Y side toward the negative (−) Y side. By securing the width G of the wall portion 60a to be large, it is possible to increase the cross-sectional area S of the vibrating arm portion 3a. As described above, by increasing the cross-sectional area S of the vibrating arm portion 3a, since the rigidity of the vibrating arm portion 3a can be increased, it is possible to suppress vibration leakage and to secure favorable driving level characteristics. In the present embodiment, since the wall portion 60a is formed over the entire region α

(see FIG. 1, hereinafter referred to as a "groove forming region α") in which the outer groove portion 51 and the inner groove portion 52 are formed, it is possible to increase the cross-sectional area S in the groove forming region α and to increase the rigidity of the vibrating arm portion 3a. Furthermore, on the negative (−)Y side of the vibrating arm portion 3a, the width G of the wall portion 60a gradually increases from the positive (+)Y side toward the negative (−)Y side. As above, by increasing the rigidity on the negative (−)Y side of the vibrating arm portion 3a, the balance between the vibration leakage, the driving level characteristics, and the CI value is adjusted to be in a desired state.

As shown in FIG. 1, excitation electrodes 10 and 11 (a first excitation electrode 10 and a second excitation electrode 11) are formed on the outer surfaces of the vibrating arms 3a and 3b, the wall portions 60a and 60b, the outer groove portion 51, and the inner groove portion 52. The excitation electrodes 10 and 11 are formed by a single-layer conductive film of chromium (Cr) or the like, for example. The excitation electrodes 10 and 11 are electrodes that vibrate the pair of vibrating arm portions 3a and 3b at a predetermined resonance frequency in a direction of moving closer to or away from each other when a voltage is applied.

The pair of excitation electrodes 10 and 11 are formed on the surfaces of the pair of vibrating arm portions 3a and 3b by patterning in an electrically isolated state.

Specifically, as shown in FIG. 2, the first excitation electrode 10 is mainly formed inside the outer groove portion 51 of one vibrating arm portion 3a, on the wall portion 60a, inside the inner groove portion 52, on the surface of the inner side surface 3c of the other vibrating arm portion 3b, and on the outer side surface 3d of the other vibrating arm portion 3b.

Moreover, the second excitation electrode 11 is mainly formed inside the outer groove portion 51 of the other vibrating arm portion 3b, on the surface of the wall portion 60b, inside the inner groove portion 52, on the inner side surface 3c of one vibrating arm portion 3a, and on the outer side surface 3d of one vibrating arm portion 3a.

As shown in FIG. 1, a weight metal film 15 configured to include a rough adjustment film 15a and a fine adjustment film 15b for performing adjustment (frequency adjustment) so that the vibrating arm portions 3a and 3b vibrate within a predetermined frequency range and is formed at the distal ends of the vibrating arm portion 3a and 3b. By performing frequency adjustment using the weight metal film 15, the frequency of the pair of the vibrating arm portions 3a and 3b can be set to fall within the nominal frequency range of the device.

(Base Portion)

As shown in FIG. 1, the piezoelectric vibrating reed 1 of the present embodiment includes the base portion 4 to which the pair of vibrating arm portions 3a and 3b are connected. The base portion 4 is disposed to be adjacent to the vibrating arm portions 3a and 3b and includes an intermediate portion 4b disposed on the positive (+)Y side of the base portion 4 and a mount portion 4a disposed on the negative (−) Y side of the base portion 4.

By connecting the negative (−)Y sides of the vibrating arm portions 3a and 3b to the intermediate portion 4b of the base portion 4, the vibrating arm portions 3a and 3b are integrally supported by the base portion 4. Extraction electrodes 14a and 14b connecting the mount electrodes 12 and 13 to the excitation electrodes 10 and 11 are formed on the outer side surface of the intermediate portion 4b. The extraction electrodes 14a and 14b are formed by a single-layer film of chromium which is the same material as the base layer of the mount electrodes 12 and 13. Therefore, it is possible to form the extraction electrodes 14a and 14b at the same time as the forming of the base layer of the mount electrodes 12 and 13. However, the present invention is not limited to this, the extraction electrodes 14a and 14b may be formed, for example, using nickel, aluminum, titanium, and the like.

A pair of mount electrodes 12 and 13 is formed on the outer side surface of the mount portion 4a. The mount electrodes 12 and 13 of the present embodiment are laminated films of chromium (Cr) and gold (Au), which are formed by forming a chromium (Cr) film having good adhesion with crystal as a base layer and then forming a thin gold (Au) film on the surface thereof as a finishing layer. However, the present invention is not limited to this, and the mount electrodes 12 and 13 may be formed by forming a chromium film and a nichrome film as a base layer and then forming a thin gold film on the surface thereof as a finishing layer.

The width of the mount portion 4a is wider than the width of the intermediate portion 4b, and the positive (+) X side surface of the mount portion 4a and the positive (+) X side surface of the intermediate portion 4b are connected by a sloped surface 4c in a tapered shape. Here, although the mount portion 4a and the intermediate portion 4b may be connected in a step shape, etching residues may be formed in the corner portions of the step when etching a crystal wafer to form the outer shape of the piezoelectric vibrating reed 1. When the etching residues are formed, it may be difficult to form the piezoelectric vibrating reed 1 in a desired shape and the characteristics of the piezoelectric vibrating reed 1 may be degraded. However, in the present embodiment, by connecting the mount portion 4a and the intermediate portion 4b by the sloped surface 4c in a tapered shape, the occurrence of etching residues is suppressed, and degradation of the characteristics of the piezoelectric vibrating reed 1 are prevented.

Effects of Embodiment

According to the present embodiment, by forming the outer groove portion 51 and the inner groove portion 52 so as to be arranged in a line in the X direction of the vibrating arm portions 3a and 3b, the wall portions 60a and 60b are formed between the outer groove portion 51 and the inner groove portion 52. Thus, it is possible to increase the cross-sectional area S of the vibrating arm portions 3a and 3b in the entire groove forming region a where the outer groove portion 51 and the inner groove portion 52 are formed. In this way, since the rigidity of the vibrating arm portions 3a and 3b in the entire groove forming region a can be increased more than when the width on the base end side of one groove portion is narrowed as in the case of JP-A-2002-76827, it is possible to suppress vibration leakage and to secure favorable driving level characteristics. Moreover, the rigidity of the vibrating arm portions 3a and 3b is increased even when the width on the base end side of the groove portion is not narrowed as in the case of JP-A-2002-76827. Therefore, it is possible to decrease the width D between the inner side surface 3c of the vibrating arm portions 3a and 3b and the inner side surface 52b of the inner groove portion 52 and the width D between the outer side surface 3d of the vibrating arm portions 3a and 3b and the outer side surface 51a of the outer groove portion 51 in the entire groove forming region α, and to suppress the CI value to a low value.

Moreover, according to the present embodiment, on the negative (−)Y side of the vibrating arm portions 3a and 3b, the width D between the inner side surface 3c of the vibrating arm portions 3a and 3b and the inner side surface 52b of the inner groove portion 52 and the width D between the outer side surface 3d of the vibrating arm portions 3a and 3b and the outer side surface 51a of the outer groove portion 51 are large. Moreover, the gap between the outer groove portion 51 and the inner groove portion 52 neighboring each other on the negative (−) Y side of the vibrating arm portion is large. Thus, it is possible to increase the cross-sectional area S on the negative (−) Y side of the vibrating arm portions 3a and 3b more than the cross-sectional area S on the positive (+) Y side of the vibrating arm portions 3a and 3b. In this way, since the rigidity on the negative (−) Y side of the vibrating arm portions 3a and 3b can be increased, it is possible to suppress vibration leakage more and to secure more favorable driving level characteristics. As a result, the balance between the vibration leakage, the driving level characteristics, and the CI value can be adjusted to be in a desired state.

First Modified Example of Embodiment

Next, a first modified example of the embodiment will be described.

Figure 3:
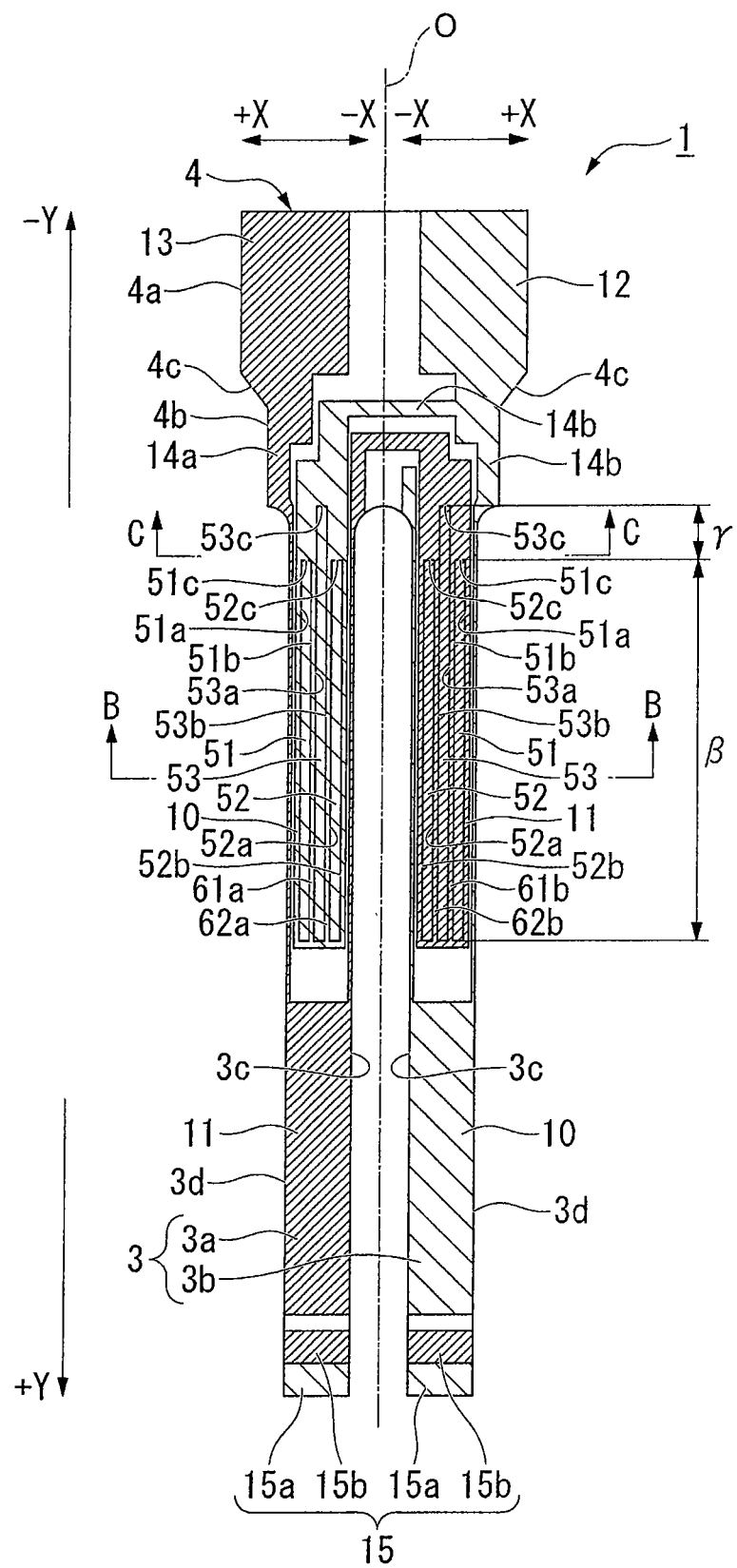
FIG. 3 is a plan view of a piezoelectric vibrating reed according to a first modified example of an embodiment.

FIG. 3 is a view illustrating a piezoelectric vibrating reed 1 according to the first modified example of the embodiment.

Figure 4A:
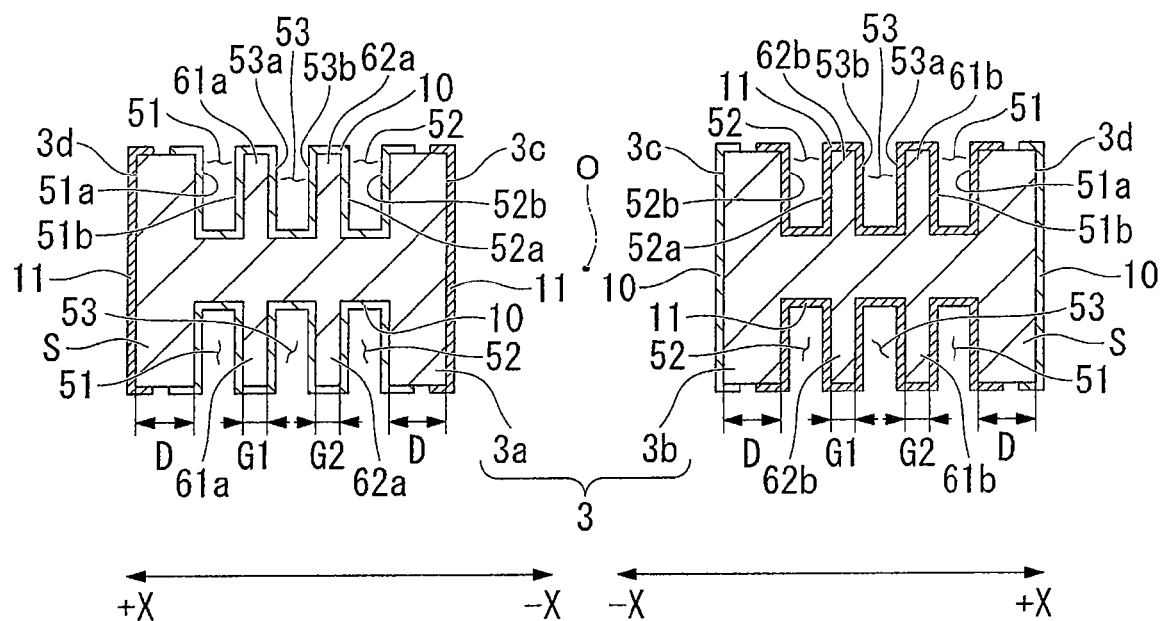
FIG. 4A is a cross-sectional view taken along the line B-B in FIG. 3.
Figure 4B:
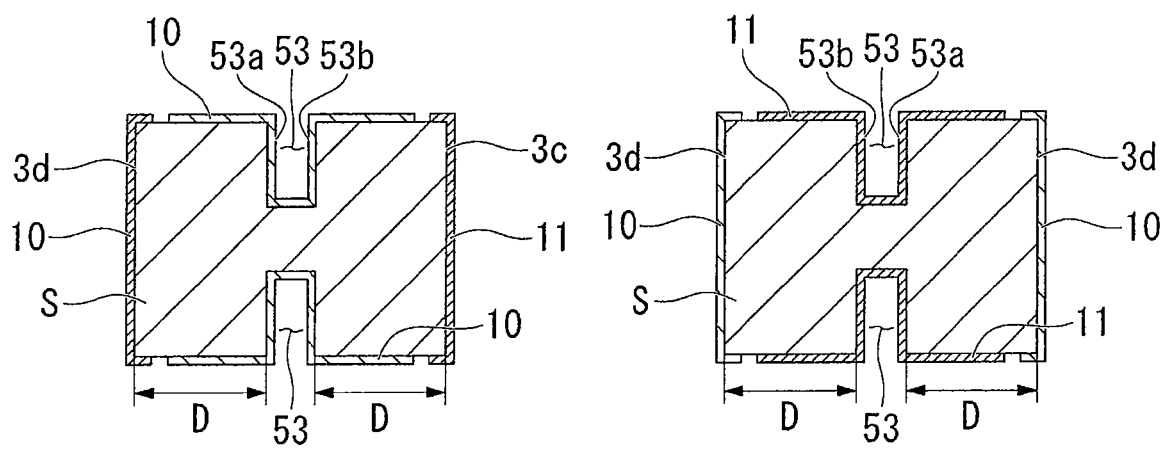
FIG. 4B is a cross-sectional view taken along the line C-C in FIG. 3.

FIGS. 4A and 4B are views illustrating the vibrating arm portions 3a and 3b, in which FIG. 4A is a cross-sectional view taken along the line B-B in FIG. 3, and FIG. 4B is a cross-sectional view taken along the line C-C in FIG. 3.

In the above-described embodiment, two groove portions of the outer groove portion 51 disposed on the positive (+) X side of the vibrating arm portion 3 and the inner groove portion 52 disposed on the negative (−) X side of the vibrating arm portion 3 are formed in the vibrating arm portion 3. In contrast, the first modified example of the present embodiment, as shown in FIG. 3 is different from the embodiment in that three groove portions are formed in the vibrating arm portion 3. Description of the same constituent portions as the embodiment will not be provided.

In the vibrating arm portion 3a of the present modified example, three groove portions are formed which are an outer groove portion 51 disposed on the positive (+) X side of the vibrating arm portion 3a, an inner groove portion 52 disposed on the negative (−) X side of the vibrating arm portion 3a, and a central groove portion 53 disposed between the outer groove portion 51 and the inner groove portion 52. The outer groove portion 51, the inner groove portion 52, and the central groove portion 53 extend in the Y direction along the central axis O and are arranged in a line approximately in parallel to the X direction.

As shown in FIG. 4A, a first wall portion 61a having a width of G1 is formed between the outer groove portion 51 and the central groove portion 53. Moreover, a second wall portion 62a having a width of G2 is formed between the central groove portion 53 and the inner groove portion 52. In the present modified example, the width G1 of the first wall portion 61a is approximately the same as the width G2 of the second wall portion 62a.

The first wall portion 61a and the second wall portion 62a are formed in a region β (see FIG. 3, hereinafter referred to as a "plural groove forming region β") where the outer groove portion 51, the inner groove portion 52, and the central groove portion 53 are formed. Thus, in the plural groove forming region β, it is possible to increase the cross-sectional area S of the vibrating arm portion 3a more than the piezoelectric vibrating reed of JP-A-2002-76827 and to increase the rigidity of the vibrating arm portion 3a. Thus, it is possible to suppress the vibration leakage and to secure favorable driving level characteristics.

The central groove base end portion 53c on the negative (−) Y side of the central groove portion 53 is disposed in the vicinity of the connection portion between the vibrating arm portion 3a and the base portion 4. In contrast, the outer groove base end portion 51c on the negative (−) Y side of the outer groove portion 51 and the inner groove base end portion 52c on the negative (−) Y side of the inner groove portion 52 are disposed closer to the positive (+) Y side (the distal end side) than the central groove base end portion 53c. Thus, a region in the vicinity of the connection portion between the vibrating arm portion 3a and the base portion 4 is a region γ (hereinafter referred to as an "inner and outer groove non-forming region γ") where only the central groove portion 53 is formed.

As shown in FIG. 4B, in the inner and outer groove non-forming region γ, since the outer groove portion 51 and the inner groove portion 52 are not formed, the vibrating arm portion 3a has an approximately H-shaped cross-section.

Moreover, in the inner and outer groove non-forming region γ, it is possible to further increase the cross-sectional area S of the vibrating arm portion 3a than that of the plural groove forming region β by the amount corresponding to the cross-sectional area of the outer groove portion 51 and the inner groove portion 52.

Effects of First Modified Example of Embodiment

According to the first modified example of the present embodiment, the outer groove base end portion 51c on the negative (−) Y side of the outer groove portion 51 and the inner groove base end portion 52c on the negative (−) Y side of the inner groove portion 52 are disposed closer to the positive (+) Y side (the distal end side) than the central groove base end portion 53c of the central groove portion 53. Thus, it is possible to increase the cross-sectional area S on the negative (−) Y side (the base end side) of the vibrating arm portions 3a and 3b than the cross-sectional area on the positive (+) Y side of the vibrating arm portions 3a and 3b. In this way, since the rigidity on the negative (−) Y side of the vibrating arm portions 3a and 3b can be increased, it is possible to suppress vibration leakage more and to secure more favorable driving level characteristics. As a result, the balance between the vibration leakage, the driving level characteristics, and the CI value can be adjusted to be in a desired state.

Second Modified Example of Embodiment

Next, a second modified example of the embodiment will be described.

Figure 5:
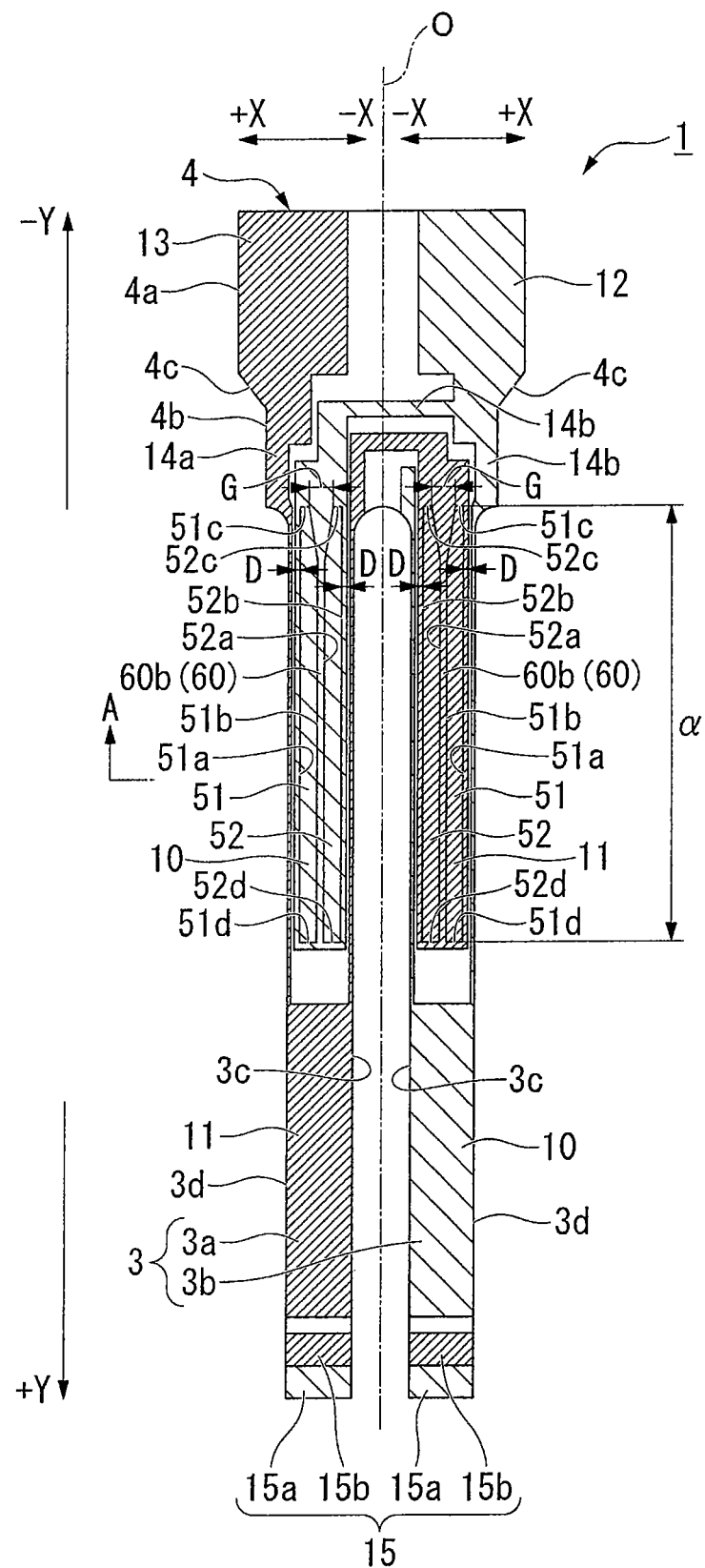
FIG. 5 is a plan view of a piezoelectric vibrating reed according to a second modified example of the embodiment.

FIG. 5 is a view illustrating a piezoelectric vibrating reed 1 according to the first modified example of the embodiment.

In the above-described embodiment, the outer side surface 51a of the outer groove portion 51 is sloped toward the inner side, and the inner side surface 51b of the outer groove portion 51 is sloped toward the outer side. Moreover, the outer side surface 52a of the inner groove portion 52 is sloped toward the inner side, and the inner side surface 52b of the inner groove portion 52 is sloped toward the outer side.

In contrast, in the second modified example of the embodiment, the outer side surface 51a of the outer groove portion 51 is formed along the central axis O, and the inner side surface 51b of the outer groove portion 51 is sloped toward the outer side. Moreover, the outer side surface 52a of the inner groove portion 52 is sloped toward the inner side, and the inner side surface 52b of the inner groove portion 52 is formed along the central axis O.

From the above respect, the second modified example of the present embodiment is different from the embodiment. Description of the same constituent portions as the embodiment will not be provided.

As shown in FIG. 5, the outer groove portion 51 of the present modified example is formed so that the width of the outer groove base end portion 51c is narrower than the width of the outer groove distal end portion 51d. Specifically, the outer side surface 51a and the inner side surface 51b of the outer groove portion 51 are formed so as to extend from the outer groove distal end portion 51d approximately in parallel toward the negative (−) Y side, and at a predetermined position, only the inner side surface 51b is sloped toward the positive (+) X side, whereby the outer groove portion 51 is gradually narrowed in a tapered shape. In addition, the outer side surface 51a of the outer groove portion 51 is formed so as to extend from the outer groove distal end portion 51d over the outer groove base end portion 51c approximately in parallel to the outer side surface 3d of the piezoelectric vibrating reed 1. Thus, in a region where the outer groove portion 51 is formed, the width D between the outer side surface 51a of the outer groove portion 51 and the outer side surface 3d of the vibrating arm portion 3a is constant.

Moreover, similarly to the outer groove portion 51, the inner groove portion 52 of the present modified example is formed so that the width of the inner groove base end portion 52c is narrower than the width of the inner groove distal end portion 52d. Specifically, the outer side surface 52a and the inner side surface 52b of the inner groove portion 52 are formed so as to extend from the inner groove distal end portion 52d approximately in parallel toward the negative (−) Y side, and at a predetermined position, only the outer side surface 52a is sloped toward the negative (−) X side, whereby the inner groove portion 52 is gradually narrowed in a tapered shape. In addition, similarly to the above, in a region where the inner groove portion 52 is formed, the width D between the inner side surface 52b of the inner groove portion 52 and the inner side surface 3c of the vibrating arm portion 3a is constant.

By forming the outer groove portion 51 and the inner groove portion 52 in the above-described manner, the gap between the outer groove portion 51 and the inner groove portion 52 on the negative (−) Y side (the base end side) is larger than the gap between the outer groove portion 51 and the inner groove portion 52 on the positive (+) Y side (the distal end side). In other words, on the negative (−) Y side of the vibrating arm portion 3a, the width G of the wall portion 60a is gradually increased from the positive (+) Y side to the negative (−) Y side. Thus, the cross-sectional area S on the negative (−) Y side of the vibrating arm portion 3a is increased and the rigidity thereof is increased.

Effects of Second Modified Example of Embodiment

According to the second modified example of the present embodiment, the gap between the outer groove portion 51 and the inner groove portion 52 neighboring each other on the negative (−) Y side (the base end side) of the vibrating arm portions 3a and 3b is increased. Thus, it is possible to increase the cross-sectional area S on the negative (−) Y side of the vibrating arm portions 3a and 3b more than the cross-sectional area S on the positive (+) Y side (the distal end side) of the vibrating arm portions 3a and 3b without increasing the width D between the outer side surface 51a of the outer groove portion 51 and the outer side surface 3d of the vibrating arm portion 3a and the width D between the inner side surface 52b of the inner groove portion 52 and the inner side surface 3c of the vibrating arm portion 3a. In this way, it is possible to suppress vibration leakage while maintaining the CI value at a desired value and to secure favorable driving level characteristics.

(Piezoelectric Vibrator)

Next, a piezoelectric vibrator 30 using the piezoelectric vibrating reed 1 according to the present embodiment will be described.

Figure 6:
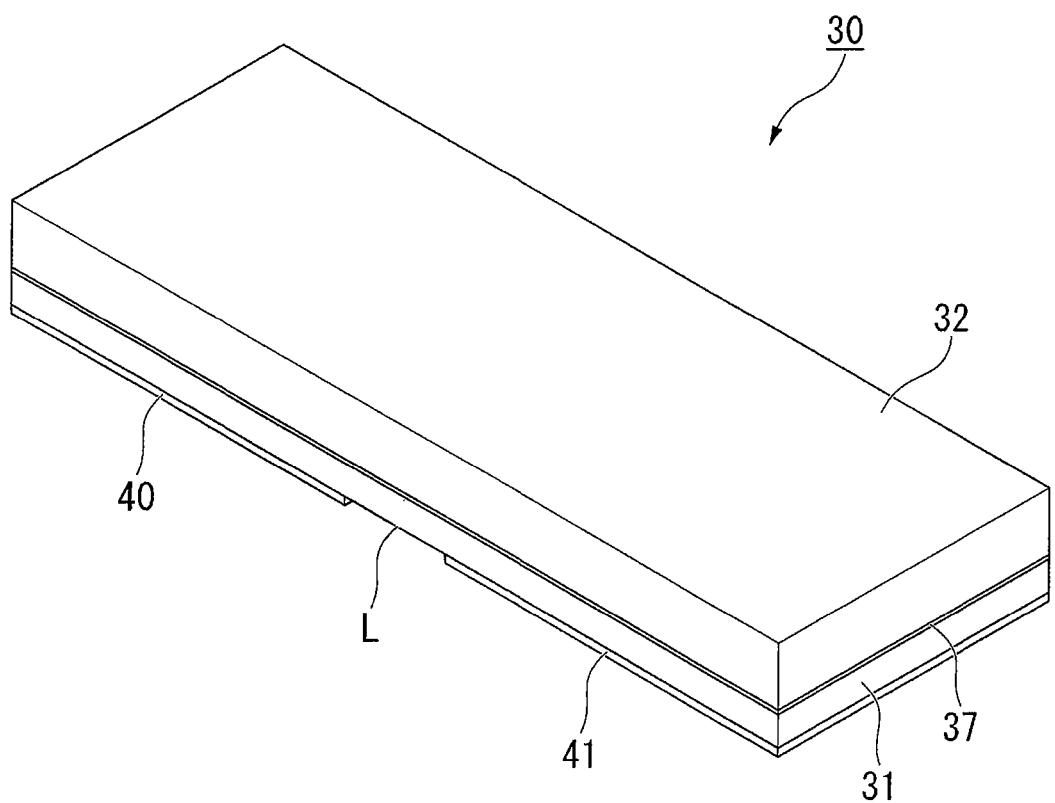
FIG. 6 is a perspective view showing the external appearance of a piezoelectric vibrator.

FIG. 6 is a perspective view showing the external appearance of the piezoelectric vibrator 30.

Figure 7:
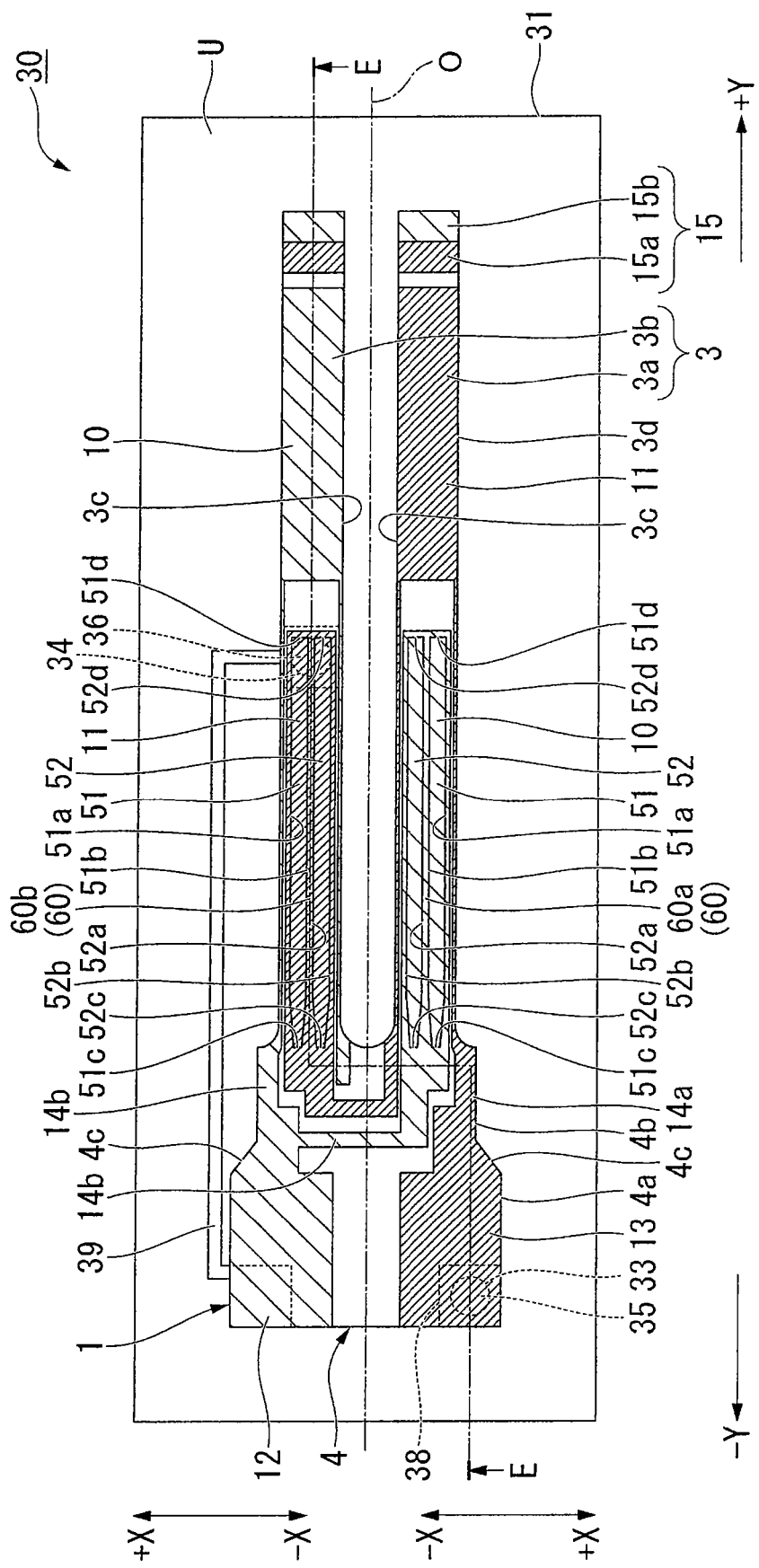
FIG. 7 is a view showing the internal configuration of the piezoelectric vibrator and is also a plan view in a state where a lid substrate is removed.

FIG. 7 is a view showing the internal configuration of the piezoelectric vibrator 30 and is also a plan view in a state where a lid substrate 32 is removed.

Figure 8:
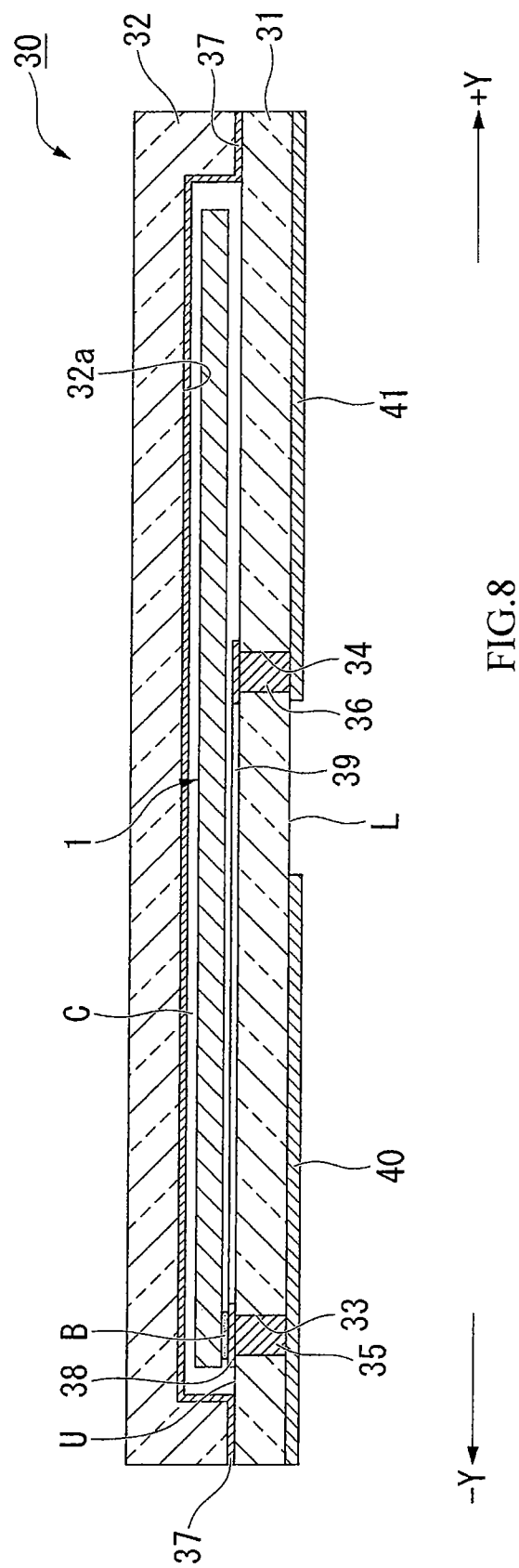
FIG. 8 is a cross-sectional view taken along the line E-E in FIG. 7.

FIG. 8 is a cross-sectional view taken along the line E-E in FIG. 7.

Figure 9:
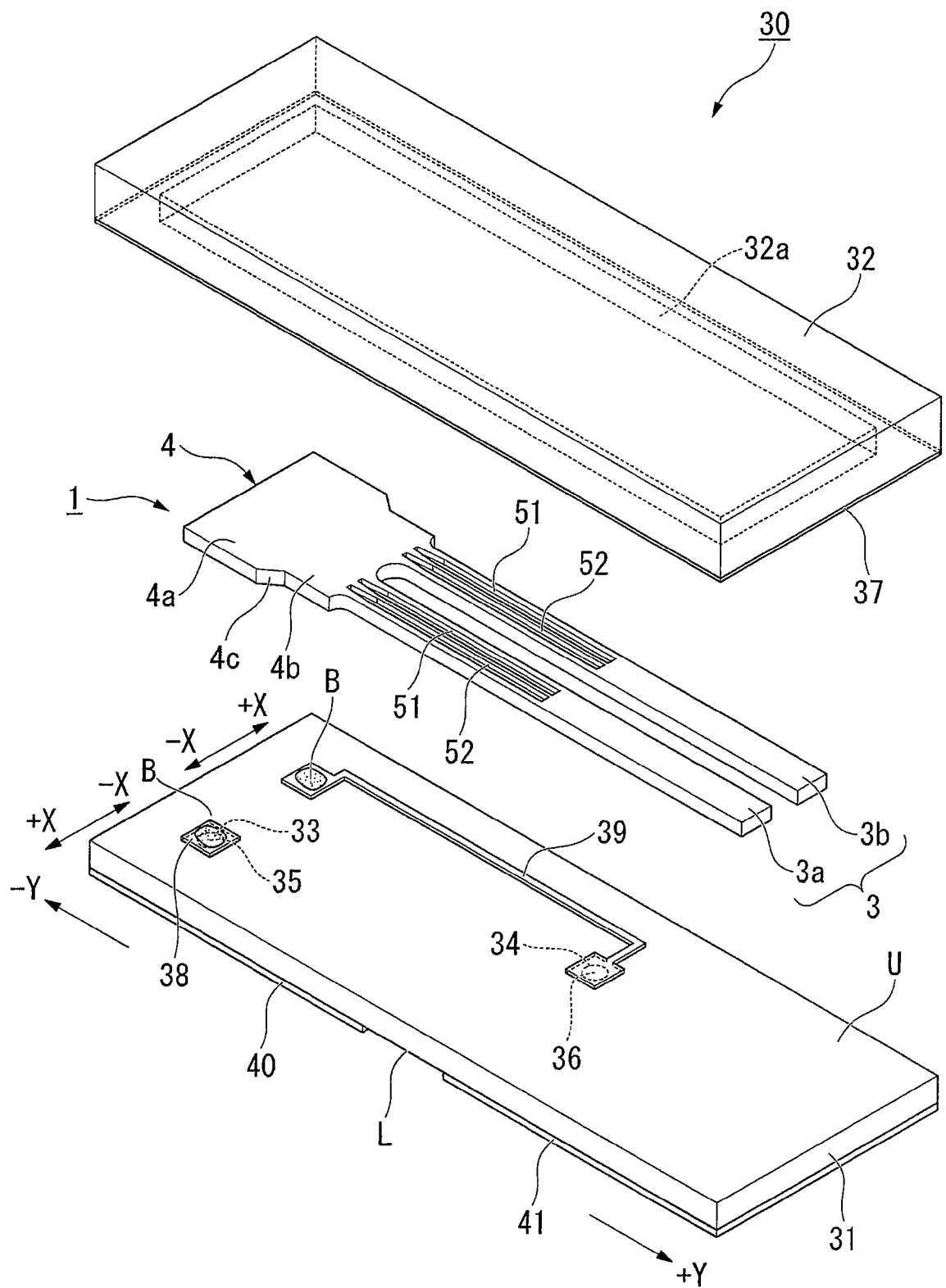
FIG. 9 is an exploded perspective view of the piezoelectric vibrator.

FIG. 9 is an exploded perspective view of the piezoelectric vibrator 30 shown in FIG. 6.

Furthermore, the bonding surface of a base substrate 31 bonded to the lid substrate 32 will be called first surface U, and the outer surface of the base substrate 31 will be called second surface L. In FIG. 9, for better understanding of the drawings, the excitation electrodes 10 and 11, the extraction electrodes 14a and 14b, the mount electrodes 12 and 13, and the weight metal film 15 are not illustrated.

As shown in FIG. 6, the piezoelectric vibrator 30 is a surface mounted device-type piezoelectric vibrator 30 which includes a package, in which a base substrate 31 and a lid substrate 32 are anodically bonded to each other with a bonding film 37 disposed therebetween, and a piezoelectric vibrating reed 1 (see FIG. 7) which is accommodated in a cavity C of the package.

The base substrate 31 and the lid substrate 32 are substrates that can be anodically bonded and that are made of a glass material, for example, soda-lime glass, and are formed in a plate-like form. On the bonding surface side of the lid substrate 32 to be bonded to the base substrate 31, a cavity recess 32a is formed in which the piezoelectric vibrating reed 1 is accommodated.

A bonding film 37 for anodic bonding is formed on the entire surface on the bonding surface side of the lid substrate 32 to be bonded to the base substrate 31. That is, the bonding film 37 is formed in a frame region at the periphery of the cavity recess 32a in addition to the entire inner surface of the cavity recess 32a. Although the bonding film 37 of the present embodiment is made of a silicon film, the bonding film 37 may be made of aluminum (Al) or Cr. As will be described later, the bonding film 37 and the base substrate 31 are anodically bonded, whereby the cavity C is vacuum-sealed.

As shown in FIG. 8, the piezoelectric vibrator 30 includes penetration electrodes 35 and 36 which penetrate through the base substrate 31 in the thickness direction thereof so that the inside of the cavity C is electrically connected to the outside of the piezoelectric vibrator 30. The penetration electrodes 35 and 36 are disposed in penetration holes 33 and 34 which penetrate through the base substrate 31.

The cross section in the direction perpendicular to the central axis of the penetration holes 33 and 34 has an approximately circular shape. Moreover, the penetration holes 33 and 34 are formed so that the piezoelectric vibrator 30 is received in the cavity C when the piezoelectric vibrator 30 is formed. More specifically, the penetration holes 33 and 34 are formed such that one penetration hole 33 is positioned at the corresponding position on the negative (−) Y side of the piezoelectric vibrating reed 1, and the other penetration hole 34 is formed at the corresponding position on the positive (+) Y sides of the vibrating arm portions 3a and 3b.

The penetration electrodes 35 and 36 are formed, for example, by inserting a metal pin (not shown) into the penetration holes 33 and 34, filling a glass fit between the penetration holes 33 and 34 and the metal pin, and baking the glass frit. In this way, since it is possible to completely block the penetration holes 33 and 34 by the metal pin and the glass frit, the penetration electrodes 35 and 36 serve to make lead-out electrodes 38 and 39 and external electrodes 40 and 41 described later electrically connected to each other while maintaining airtightness in the cavity C.

As shown in FIG. 9, a pair of lead-out electrodes 38 and 39 is patterned on the first surface U side of the base substrate 31. One lead-out electrode 38 among the pair of lead-out electrodes 38 and 39 is formed so as to be disposed right above one penetration electrode 35. Moreover, the other lead-out electrode 39 is formed so as to be disposed right above the other penetration electrode 36 after being led out from a position next to the lead-out electrode 38 and extended along the vibrating arm portions 3a and 3b toward the positive (+)Y side.

Moreover, tapered bumps B made of gold or the like are formed on the pair of lead-out electrodes 38 and 39, and the pair of mount electrodes 12 and 13 of the piezoelectric vibrating reed 1 are realized on the lead-out electrodes 38 and 39 using the bumps B. In this way, one mount electrode 13 of the piezoelectric vibrating reed 1 is electrically connected to one penetration electrode 35 through one lead-out electrode 38, and the other mount electrode 12 is electrically connected to the other penetration electrode 36 through the other lead-out electrode 39.

Moreover, a pair of external electrodes 40 and 41 is formed on the second surface L of the base substrate 31. The pair of external electrodes 40 and 41 are formed at both ends in the Y direction of the base substrate 31 and are electrically connected to the pair of penetration electrodes 35 and 36, respectively.

When the piezoelectric vibrator 30 configured in this manner is operated, a predetermined driving voltage is applied to the external electrodes 40 and 41 formed on the base substrate 31. In this way, since a voltage can be applied to the first excitation electrode 10 and the second excitation electrode 11 of the piezoelectric vibrating reed 1, it is possible to vibrate the pair of vibrating arm portions 3a and 3b at a predetermined frequency in a direction of moving closer to and further away from each other. By using this vibration of the pair of vibrating arm portions 3a and 3b, the piezoelectric vibrator 30 can be used as a time source, the timing source of a control signal, a reference signal source, and the like.

(Oscillator)

Next, an oscillator according to another embodiment of the invention will be described with reference to FIG. 10.

Figure 10:
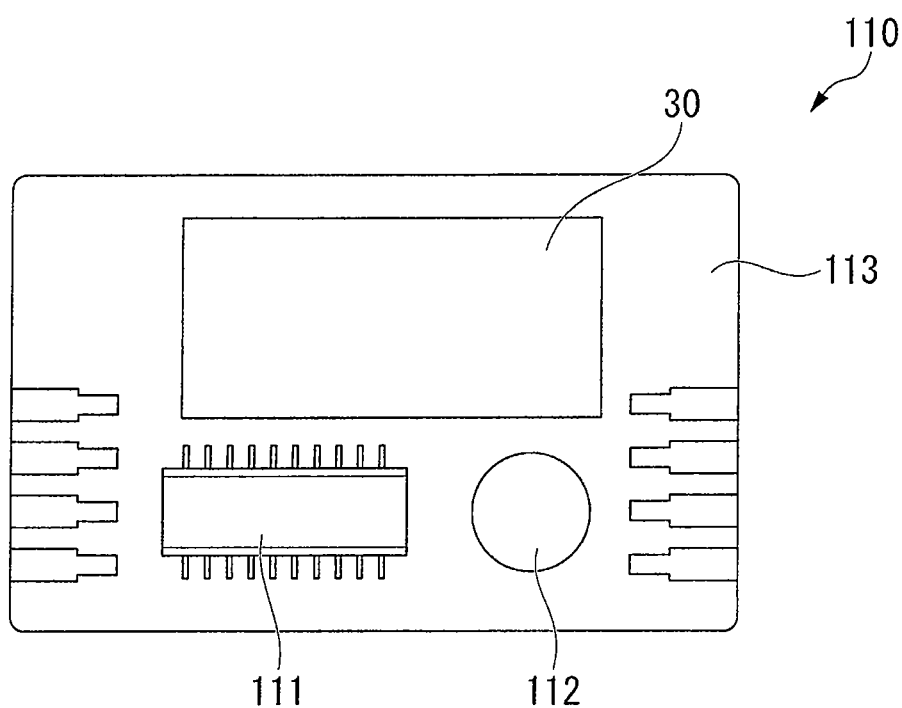
FIG. 10 is a view showing the configuration of an embodiment of an oscillator.

In an oscillator 110 according to the present embodiment, the piezoelectric vibrator 30 is used as a vibrator electrically connected to an integrated circuit 111, as shown in FIG. 10. The oscillator 110 includes a substrate 113 on which an electronic component 112, such as a capacitor, is mounted. The integrated circuit 111 for an oscillator is mounted on the substrate 113, and a piezoelectric vibrating reed of the piezoelectric vibrator 30 is mounted near the integrated circuit 111. The electronic component 112, the integrated circuit 111, and the piezoelectric vibrator 30 are electrically connected to each other by a wiring pattern (not shown). In addition, each of the constituent components is molded with a resin (not shown).

In the oscillator 110 configured as described above, when a voltage is applied to the piezoelectric vibrator 30, the piezoelectric vibrating reed in the piezoelectric vibrator 30 vibrates. This vibration is converted into an electrical signal due to the piezoelectric property of the piezoelectric vibrating reed and is then input to the integrated circuit 111 as the electrical signal. The input electrical signal is subjected to various kinds of processing by the integrated circuit 111 and is then output as a frequency signal. In this way, the piezoelectric vibrator 30 functions as an oscillator.

Moreover, by selectively setting the configuration of the integrated circuit 111, for example, an RTC (Real Time Clock) module, according to demand, it is possible to add a function of controlling the operation date or time of the corresponding device or an external device or of providing the time or calendar in addition to a single functional oscillator for a clock.

According to the oscillator 110 of the present embodiment, since the oscillator 110 includes the high performance piezoelectric vibrator 30 capable of suppressing the CI value to a low value while suppressing vibration leakage and securing favorable driving level characteristics, it is possible to provide the oscillator 110 which has good performance.

(Electronic Device)

Figure 11:
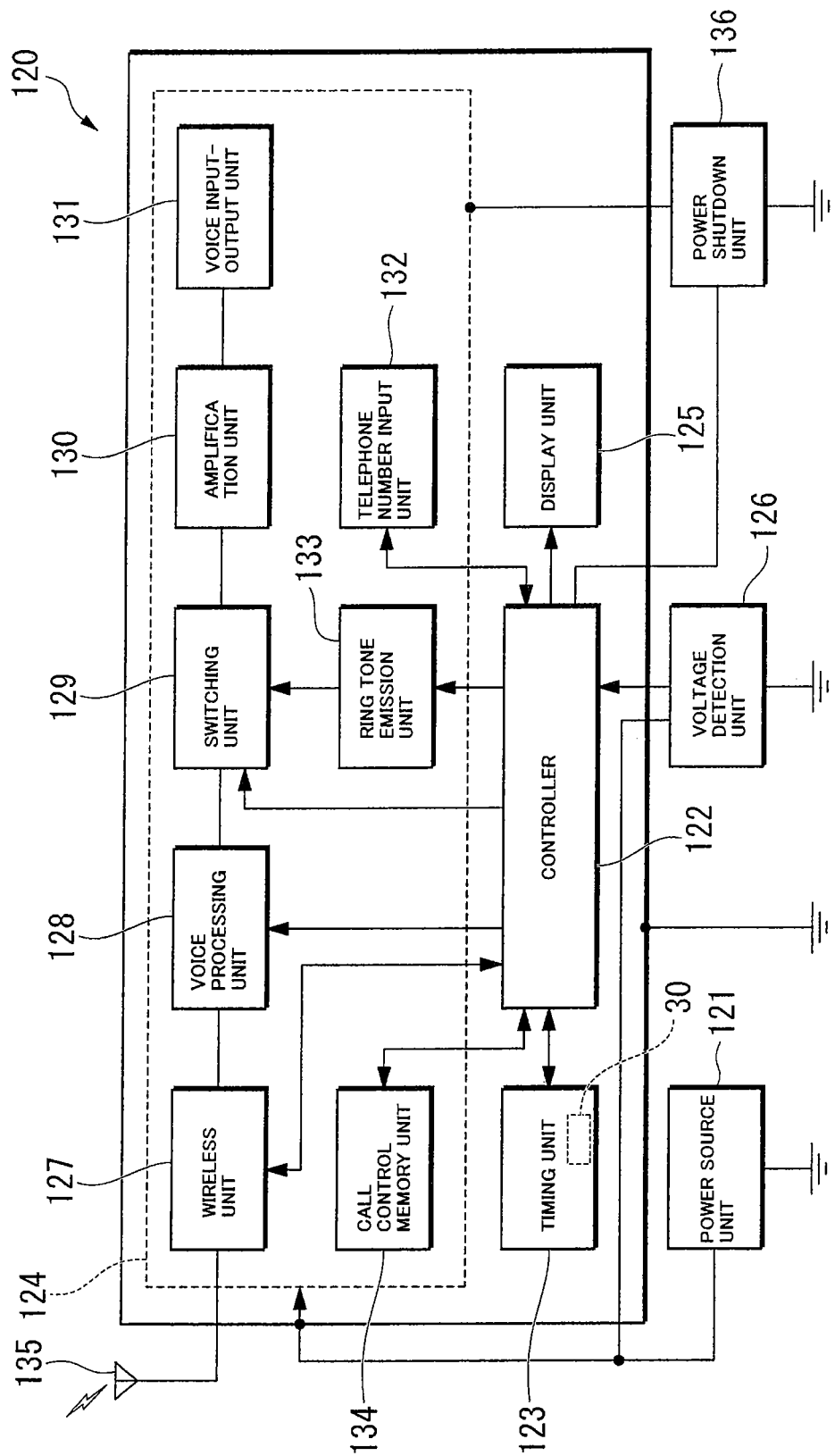
FIG. 11 is a view showing the configuration of an embodiment of an electronic device.

Next, an electronic device according to another embodiment of the invention will be described with reference to FIG. 11. In addition, a mobile information device 120 including the piezoelectric vibrator 30 will be described as an example of an electronic device.

The mobile information device 120 according to the present embodiment is represented by a mobile phone, for example, and has been developed and improved from a wristwatch in the related art. The mobile information device 120 is similar to a wristwatch in external appearance, and a liquid crystal display is disposed in a portion equivalent to a dial pad so that a current time and the like can be displayed on this screen. Moreover, when it is used as a communication apparatus, it is possible to remove it from the wrist and to perform the same communication as a mobile phone in the related art with a speaker and a microphone built in an inner portion of the band. However, the mobile information device 120 is very small and light compared with a mobile phone in the related art.

Next, the configuration of the mobile information device 120 according to the present embodiment will be described. As shown in FIG. 11, the mobile information device 120 includes the piezoelectric vibrator 30 and a power supply section 121 for supplying power. The power supply section 121 is formed of a lithium secondary battery, for example. A control section 122 which performs various kinds of control, a clock section 123 which performs counting of time and the like, a communication section 124 which performs communication with the outside, a display section 125 which displays various kinds of information, and a voltage detecting section 126 which detects the voltage of each functional section are connected in parallel to the power supply section 121. In addition, the power supply section 121 supplies power to each functional section.

The control section 122 controls an operation of the entire system. For example, the control section 122 controls each functional section to transmit or receive the audio data or to measure and display a current time. In addition, the control section 122 includes a ROM in which a program is written in advance, a CPU which reads and executes a program written in the ROM, a RAM used as a work area of the CPU, and the like.

The clock section 123 includes an integrated circuit, which has an oscillation circuit, a register circuit, a counter circuit, and an interface circuit therein, and the piezoelectric vibrator 30. When a voltage is applied to the piezoelectric vibrator 30, the piezoelectric vibrating reed vibrates, and this vibration is converted into an electrical signal due to the piezoelectric property of crystal and is then input to the oscillation circuit as the electrical signal. The output of the oscillation circuit is binarized to be counted by the register circuit and the counter circuit. Then, a signal is transmitted to or received from the control section 122 through the interface circuit, and current time, current date, calendar information, and the like are displayed on the display section 125.

The communication section 124 has the same function as a mobile phone in the related art, and includes a wireless section 127, an audio processing section 128, a switching section 129, an amplifier section 130, an audio input/output section 131, a telephone number input section 132, a ring tone generating section 133, and a call control memory section 134.

The wireless section 127 transmits/receives various kinds of data, such as audio data, to/from the base station through an antenna 135. The audio processing section 128 encodes and decodes an audio signal input from the wireless section 127 or the amplifier section 130. The amplifier section 130 amplifies a signal input from the audio processing section 128 or the audio input/output section 131 up to a predetermined level. The audio input/output section 131 is formed by a speaker, a microphone, and the like, and amplifies a ring tone or incoming sound or collects the sound.

In addition, the ring tone generating section 133 generates a ring tone in response to a call from the base station. The switching section 129 switches the amplifier section 130, which is connected to the audio processing section 128, to the ring tone generating section 133 only when a call arrives, so that the ring tone generated in the ring tone generating section 133 is output to the audio input/output section 131 through the amplifier section 130.

In addition, the call control memory section 134 stores a program related to incoming and outgoing call control for communications. Moreover, the telephone number input section 132 includes, for example, numeric keys from 0 to 9 and other keys. The user inputs a telephone number of a communication destination by pressing these numeric keys and the like.

The voltage detecting section 126 detects a voltage drop when a voltage, which is applied from the power supply section 121 to each functional section, such as the control section 122, drops below the predetermined value, and notifies the control section 122 of the detection of the voltage drop. In this case, the predetermined voltage value is a value which is set beforehand as the lowest voltage necessary to operate the communication section 124 stably. For example, it is about 3 V. When the voltage drop is notified from the voltage detecting section 126, the control section 122 disables the operation of the wireless section 127, the audio processing section 128, the switching section 129, and the ring tone generating section 133. In particular, the operation of the wireless section 127 that consumes a large amount of power should be necessarily stopped. In addition, a message informing the user that the communication section 124 is not available due to insufficient battery power is displayed on the display section 125.

That is, it is possible to disable the operation of the communication section 124 and display the notice on the display section 125 by the voltage detection section 126 and the control section 122. This message may be a character message. Or as a more intuitive indication, a cross mark (X) may be displayed on a telephone icon displayed at the top of the display screen of the display section 125.

In addition, the function of the communication section 124 can be more reliably stopped by providing a power shutdown section 136 capable of selectively shutting down the power to a section related to the function of the communication section 124.

According to the mobile information device 120 of the present embodiment, since the mobile information device 120 includes the high performance piezoelectric vibrator 30 capable of suppressing the CI value to a low value while suppressing vibration leakage and securing favorable driving level characteristics, it is possible to provide the mobile information device 120 which has good performance.

(Radio-Controlled Timepiece)

Next, a radio-controlled timepiece according to yet another embodiment of the invention will be described with reference to FIG. 12.

Figure 12:
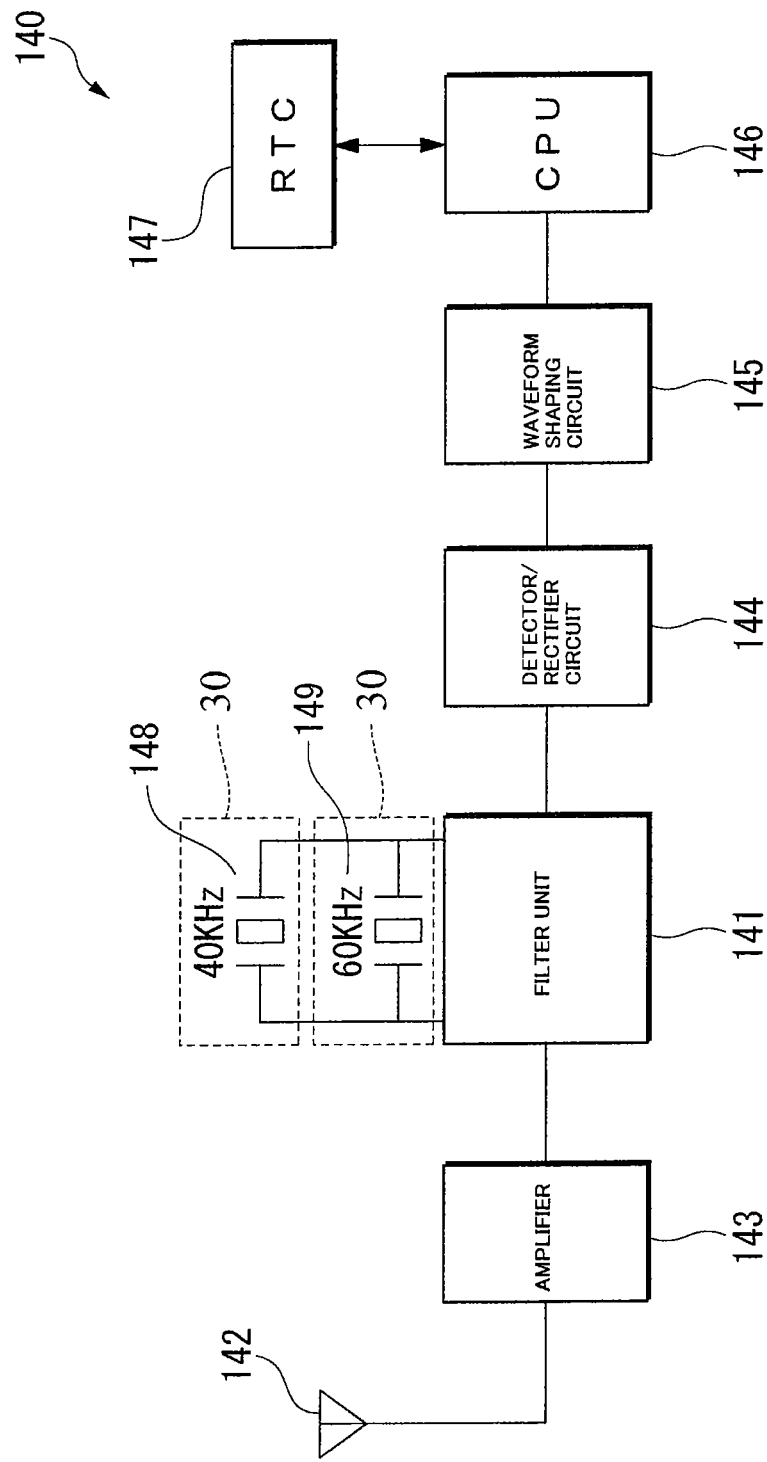
FIG. 12 is a view showing the configuration of an embodiment of a radio-controlled timepiece.

As shown in FIG. 12, a radio-controlled timepiece 140 according to the present embodiment includes the piezoelectric vibrators 30 electrically connected to a filter section 141. The radio-controlled timepiece 140 is a clock with a function of receiving a standard radio wave including clock information, automatically changing it to the correct time, and displaying the correct time.

In Japan, there are transmission centers (transmission stations) that transmit a standard radio wave in Fukushima Prefecture (40 kHz) and Saga Prefecture (60 kHz), and each center transmits the standard radio wave. A long wave with a frequency of, for example, 40 kHz or 60 kHz has both a characteristic of propagating along the land surface and a characteristic of propagating while being reflected between the ionosphere and the land surface, and therefore has a propagation range wide enough to cover the entire area of Japan through the two transmission centers.

Hereinafter, the functional configuration of the radio-controlled timepiece 140 will be described in detail.

An antenna 142 receives a long standard radio wave with a frequency of 40 kHz or 60 kHz. The long standard radio wave is obtained by performing AM modulation of the time information, which is called a time code, using a carrier wave with a frequency of 40 kHz or 60 kHz. The received long standard wave is amplified by an amplifier 143 and is then filtered and synchronized by the filter section 141 having the plurality of piezoelectric vibrators 30.

In the present embodiment, the piezoelectric vibrators 30 include crystal vibrator sections 148 and 149 having resonance frequencies of 40 kHz and 60 kHz, respectively, which are the same frequencies as the carrier frequency.

In addition, the filtered signal with a predetermined frequency is detected and demodulated by a detection and rectification circuit 144.

Then, the time code is extracted by a waveform shaping circuit 145 and counted by the CPU 146. The CPU 146 reads the information including the current year, the total number of days, the day of the week, the time, and the like. The read information is reflected on an RTC 148, and the correct time information is displayed.

Because the carrier wave is 40 kHz or 60 kHz, a vibrator having the tuning fork structure described above is suitable for the crystal vibrator sections 148 and 149.

Moreover, although the above explanation has been given for the case in Japan, the frequency of a long standard wave is different in other countries. For example, a standard wave of 77.5 kHz is used in Germany. Therefore, when the radio-controlled timepiece 140 which is also operable in other countries is assembled in a portable device, the piezoelectric vibrator 30 corresponding to frequencies different from the frequencies used in Japan is necessary.

According to the radio-controlled timepiece 140 of the present embodiment, since the radio-controlled timepiece 140 includes the high performance piezoelectric vibrator 30 capable of suppressing the CI value to a low value while suppressing vibration leakage and securing favorable driving level characteristics, it is possible to provide the radio-controlled timepiece 140 which has good performance.

In addition, the invention is not limited to the embodiments described above.

In the present embodiment, although the piezoelectric vibrating reed 1 of the present invention has been applied to the surface mounted device-type piezoelectric vibrator 30, the piezoelectric vibrating reed 1 of the present invention may be applied to a cylinder package type piezoelectric vibrator, for example.

Two groove portions are formed in each of the vibrating arm portions 3a and 3b in the present embodiment, and three groove portions are formed in each of the vibrating arm portions 3a and 3b in the first modified example of the present embodiment. However, the number of groove portions formed in each of the vibrating arm portions 3a and 3b is not limited to the numbers mentioned in the present embodiment and the respective modified examples.

In the present embodiment and the second modified example of the present embodiment, the groove portion is formed in a tapered shape so as to be narrowed from the positive (+) Y side to the negative (−) Y side. However, for example, the groove portion may be formed so as to be narrowed in a stair shape.

In the present embodiment, although the present invention has been described by way of an example of the general tuning-fork type piezoelectric vibrating reed 1, the present invention is not limited to this but may be applied to various types of piezoelectric vibrating reed having the vibrating arm portion.

Figure 13:
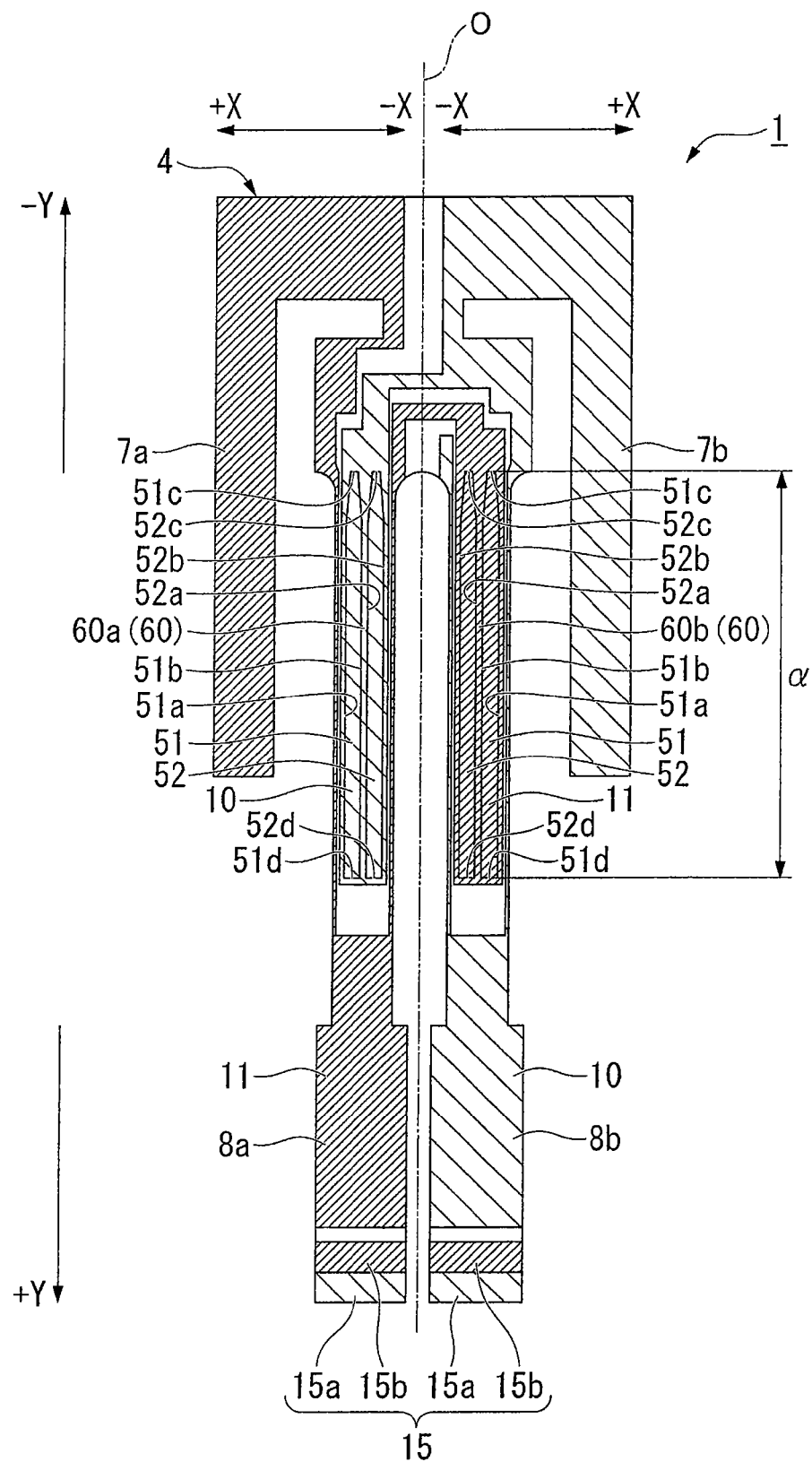
FIG. 13 is a view illustrating another application example of the present invention.
Figure 14:
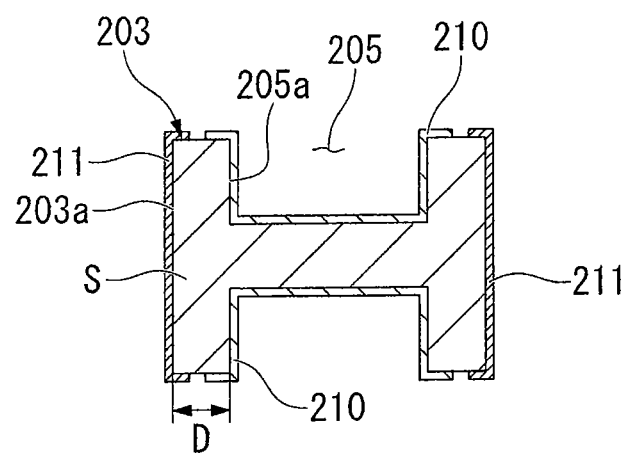
FIG. 14 is a view illustrating the related art.

FIG. 13 is a view illustrating another application example of the present invention.

A piezoelectric vibrating reed 1 shown in FIG. 13 includes a pair of vibrating arm portions 3a and 3b, a base portion 4 that connects the negative (−) Y sides of the vibrating arm portions 3a and 3b, and a pair of side base portions 7a and 7b which are disposed at both ends in the X direction of the vibrating arm portions 3a and 3b with a gap therebetween and of which the negative (−) Y side is connected to the base portion 4. The piezoelectric vibrating reed 1 is a so-called hammer head-type piezoelectric vibrating reed 1 in which large width portions 8a and 8b having a larger width than that of the negative (−) Y side are formed on the positive (+) Y sides of the vibrating arm portions 3a and 3b. Since the hammer head-type piezoelectric vibrating reed 1 can easily vibrate even when the vibrating arm portions 3a and 3b are shortened by increasing the weight on the positive (+) Y sides of the vibrating arm portions 3a and 3b, it is possible to miniaturize the piezoelectric vibrating reed 1 efficiently. Moreover, since the piezoelectric vibrating reed 1 can be tightly mounted by the side base portions 7a and 7b, it is possible to suppress vibration leakage efficiently.

The present invention can be applied to the hammer head-type piezoelectric vibrating reed 1 by forming the groove portions similarly to the embodiment and the respective modified examples of the embodiment. In this case, the same effects as those of the embodiment and the modified examples can be obtained.

What is claimed is:

1. A tuning-fork type piezoelectric vibrating reed comprising:
   a base;
   a pair of arms having proximal ends attached to the base and extending in parallel from the base, each arm including at least two grooves running in parallel along the arm; and
   a wall portion between the at least two grooves, the wall portion having a cross-sectional area that is greater at proximal ends of the grooves than at distal ends of the grooves.

2. The piezoelectric vibrating reed according to claim 1, wherein the proximal ends of the grooves are located near the proximal ends of the arms.

3. The piezoelectric vibrating reed according to claim 1, wherein the distal ends of the grooves are located near middle regions of the arms along their lengths.

4. The piezoelectric vibrating reed according to claim 1, wherein a width of the grooves at the proximal ends of the grooves is narrower than the width of the grooves at the distal ends of the grooves.

5. The piezoelectric vibrating reed according to claim 1, wherein a width of the wall portion between two adjacent grooves is wider at the proximal ends of the grooves than at the distal ends of the grooves.

6. The piezoelectric vibrating reed according to claim 1, wherein the at least two grooves comprises three grooves in an upper face and a lower face of each of the arms and having a wall portion between adjacent pairs of the three grooves.

7. A tuning-fork type piezoelectric vibrating reed comprising:
   a base; and
   a pair of arms having proximal ends attached to the base and extending in parallel from the base, each arm includes three grooves running along the arm,
   wherein in each arm, a proximal end of a center groove terminates at a point more proximal than those of the other grooves.

8. A piezoelectric vibrator comprising the piezoelectric vibrating reed according to claim 1.

9. An oscillator in which the piezoelectric vibrator according to claim 8 is electrically connected to an integrated circuit.

10. An electronic device in which the piezoelectric vibrator according to claim 8 is electrically connected to a clock section.

11. A radio-controlled time piece in which the piezoelectric vibrato according to claim 8 is electrically connected to a filter.

\* \* \* \* \*